United States Patent
Yiu et al.

(10) Patent No.: US 8,981,497 B2
(45) Date of Patent: Mar. 17, 2015

(54) CHIP PACKAGE STRUCTURE AND METHOD FOR FORMING THE SAME

(75) Inventors: Ho-Yin Yiu, Jhongli (TW); Chien-Hung Liu, Jhongli (TW); Tsang-Yu Liu, Jhongli (TW); Ying-Nan Wen, Jhongli (TW); Yen-Shih Ho, Jhongli (TW)

(73) Assignee: Xintec Inc., Taoyuan (TW)

( * ) Notice: Subject to any disclaimer, the term of this patent is extended or adjusted under 35 U.S.C. 154(b) by 174 days.

(21) Appl. No.: 13/548,663

(22) Filed: Jul. 13, 2012

(65) Prior Publication Data

US 2013/0020693 A1 Jan. 24, 2013

Related U.S. Application Data

(60) Provisional application No. 61/509,305, filed on Jul. 19, 2011.

(51) Int. Cl.
| | |
|---|---|
| H01L 27/14 | (2006.01) |
| H01L 29/82 | (2006.01) |
| H01L 29/84 | (2006.01) |
| B81B 3/00 | (2006.01) |
| H01L 27/146 | (2006.01) |

(52) U.S. Cl.
CPC ......... B81B 3/0051 (2013.01); *H01L 27/14618* (2013.01); *B81B 2201/025* (2013.01)

USPC .................. 257/414; 257/415; 257/678

(58) Field of Classification Search
CPC ............... H01L 2924/1461; B81B 2201/0235; B81B 2203/06; B81B 2201/0242; B81B 2201/025; B81B 7/0048; B81B 2203/0163; B81B 2207/053; B81B 3/0062; B81B 5/00
USPC ........................................ 257/414, 415, 678
See application file for complete search history.

(56) References Cited

U.S. PATENT DOCUMENTS

| | | | |
|---|---|---|---|
| 2006/0131714 A1* | 6/2006 | Picciotto et al. | 257/686 |
| 2011/0298064 A1* | 12/2011 | Pahl et al. | 257/415 |

* cited by examiner

*Primary Examiner* — Thien F Tran
(74) *Attorney, Agent, or Firm* — Liu & Liu

(57) ABSTRACT

A chip package structure and a method for forming the chip package structure are disclosed. At least a block is formed on a surface of a cover, the cover is mounted on a substrate having a sensing device formed thereon for covering the sensing device, and the block is disposed between the cover and the sensing device. In the present invention, the block is mounted on the cover, there is no need to etch the cover to form a protruding portion, and thus the method of the present invention is simple and has low cost.

18 Claims, 1 Drawing Sheet

US 8,981,497 B2

CHIP PACKAGE STRUCTURE AND METHOD FOR FORMING THE SAME

CLAIM OF PRIORITY

This application claims priority under 35 USC 119(e) to U.S. Provisional Application Ser. No. 61/509,305, filed Jul. 19, 2011, each of which is incorporated by reference in its entirety.

BACKGROUND OF THE INVENTION

1. Field of the Invention

The present invention relates to chip package structures and methods for forming the chip package structures, and, more particularly, to a package structure for a micro-electro-mechanical system.

2. Description of Related Art

It is the trend to develop a chip package structure with small volume and high performance. There are various types of chip package structures, such as opto electronic devices, micro-electro-mechanical system (MEMS) or sensors.

As shown in FIG. 1, a chip package structure 1 for a micro-electro-mechanical system includes a chip 10 having a sensing device 11 thereon, and a silicon cover 12 having an inner protruding portion and coupled to the chip 10 for covering the sensing device 11. The sensing device 11 has an inertial object 110 having a corresponding protruding portion 120, and an elastic component 111 connected to the inertial object 110 and the chip 10.

While the elastic component 111 moves the inertial object 110 along a linear direction (such as horizontal direction), the vibration of the inertial object 110 along another direction (such as a vertical direction) is limited by the protruding portion 120 to be within an acceptable range, so as to prevent the inertial object 110 from leaving a predetermined path.

However, the conventional silicon cover 12 is provided or made by a wafer fabrication factory, such that the silicon cover 12 is made of inorganic materials, and the protruding portion is made by etching. The etching process includes multiple steps such that the fabrication of the silicon cover 12 takes long time, needs various materials (such as etching solution, resist layer) and thus has high cost.

SUMMARY OF THE INVENTION

The present invention provides a method for forming a chip package structure. In the method of the present invention, a block is formed on a surface of a cover to be correspondingly disposed over an inertial object. When an elastic component moves the inertial object along a predetermined direction, the vibration of the inertial object along other directions is limited by the block to be within an acceptable range, so as to prevent the inertial object from moving away from a predetermined path.

Hence, the convention silicon cover made by etching is eliminated by mounting a cover in the method of the present invention, such that the method of the present invention is simple and has low cost.

Accordingly, the present invention further provides a chip package structure disclosed in the following descriptions.

DETAILED DESCRIPTION OF THE PREFERRED EMBODIMENTS

The detailed description of the present invention is illustrated by the following specific examples. Persons skilled in the art can conceive the other advantages and effects of the present invention based on the disclosure contained in the specification of the present invention.

In the present invention, the structure, scale and size shown in drawings are provided for persons skilled in the art to understand the disclosure of the present invention rather than limiting the practice of the present invention. The present invention covers any modifications, variations and adjustments of the structures which achieve effects and purposes of the present invention. In addition, the terms, such as "above," "under," "before," "left," "right" and "one", herein are used for illustrating the present invention rather than limiting the scope of the present invention.

According to the present invention, the chip package structure may be used in various micro-electro-mechanical systems (MEMS), especially image sensors using changes in electricity or capacity change for measurement. The wafer scale package (WSP) may be used for packaging image sensors, RF circuits, accelerators, gyroscopes, micro actuators or pressure sensors.

In the above package process, wafers are packaged, and then cut into packages. In one embodiment, the separated semiconductor chips are arranged in a carrier wafer or a silicon substrate for the package process.

Figure 1:
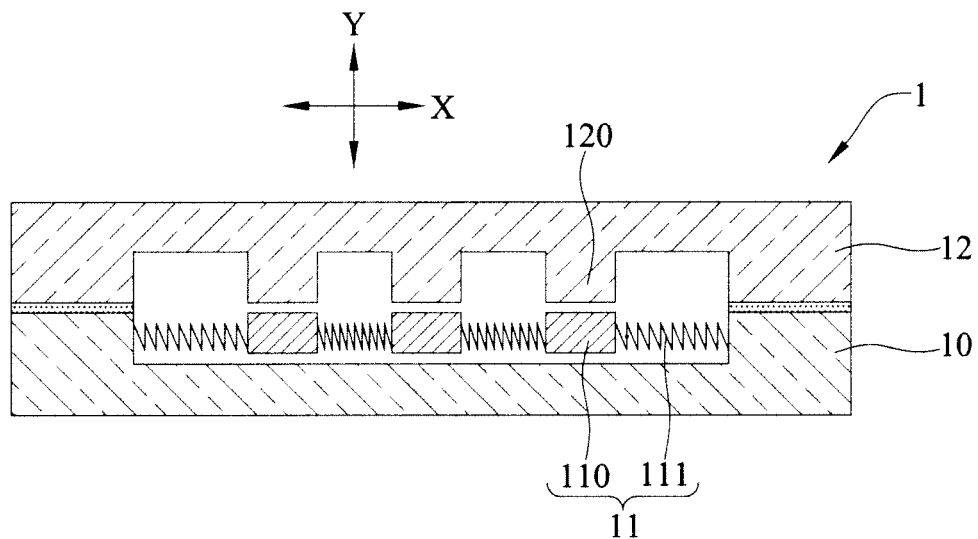
FIG. 1 is a cross-sectional view of a chip structure package according to the prior art.
Figure 2:
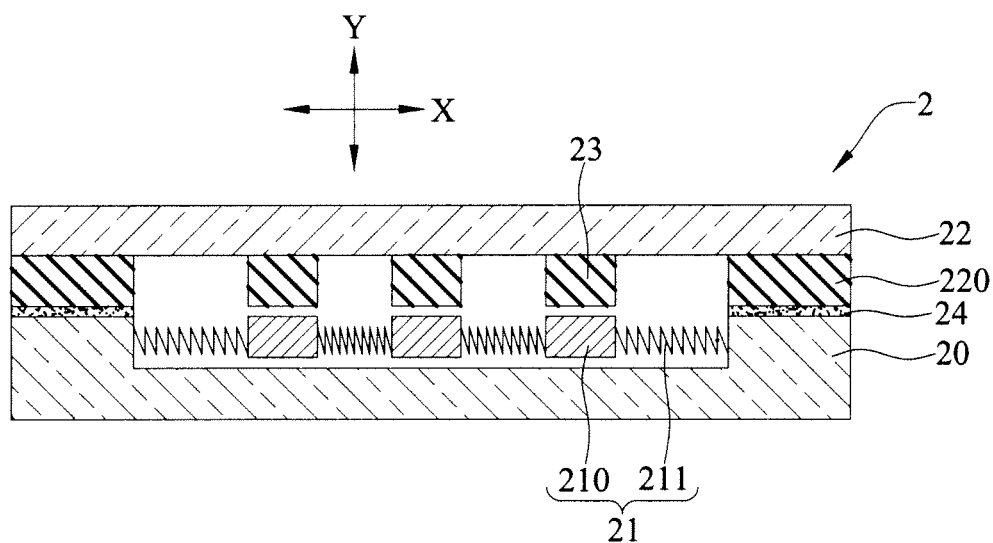
FIG. 2 is a cross-sectional of a chip package structure according to the present invention.

FIG. 2 is a cross-sectional view of a chip package structure 2 according to the present invention. The chip package structure 2 is used in micro-electro-mechanical systems and sensors, such as accelerators or gyroscopes. The chip package structure 2 includes a substrate 20 having at least a sensing device 21 formed on a substrate 20, a cover 22 mounted on the substrate 20 for covering the sensing device 21, and at least a block 23 formed on the cover 22 and disposed between the cover 22 and the sensing device 21.

In an embodiment, the substrate 20 is a chip for a micro-electro-mechanical system, and may be made of a semiconductor material, a compound or sapphire.

According to the present invention, at least a block 23 is formed on a surface of a cover 22, a substrate 20 having a surface formed with at least a sensing device 21 is provided, and the cover 22 is mounted on the substrate 20 for covering the sensing device 21, wherein the block 23 is correspondingly disposed between the cover 22 and the sensing device 21. In the wafer package process, the cover 22 may be a wafer-sized sheet, and may be made of silicon or glass. Before completing the chip package structure, the substrate 20 may be a chip or a wafer. If the substrate 20 is a wafer, the wafer is cut into multiple packages. Further, if the substrate 20 is a wafer, the cover 22 has a corresponding size, and a corresponding block 23 is formed. When the cover 22 has the size for covering a single package, there is no need to cut the cover 22.

The sensing device 21 has at least an inertial object 210, and a conveying component 211 connected to the inertial object 210 and the substrate 20 for moving the inertial object 210. Further, the block 23 is disposed and corresponding to the inertial object 210 for limiting the movement of the inertial object 210 in a direction perpendicular to the surface of the substrate 20. In this embodiment, the amount and position of the block 23 are determined according to the inertial object 210 on the substrate 20. The conveying component 211 is an elastic component such as a spring or an expansion stick.

Preferably, the cover 22 is a sheet and formed with a supporting block 220, such that the substrate 20 is covered by the cover 22 via the supporting block 220. The block 23 may be formed on the cover 22 by printing or exposure. The block 23 may be made of an organic insulation material such as epoxy, silicone or benzocyclobutene (BCB). Preferably, the supporting block and the block are made of the same material, and formed in the same step.

In the step of mounting the cover 22 on the substrate 20, the cover 22 is adhered to the substrate 20 via an adhesive 24. As shown in FIG. 2, the supporting block 220 is adhered on the substrate 20 via the adhesive 24. Further, the distance between the block 23 and the inertial object 210 is controlled by the adhesive 24. In an embodiment, the distance is preferably 3 to 5 μm.

When the chip package structure 2 is activated, the moving direction of the inertial object 210 is the conveying direction of the conveying component 211, the vertical (upward or downward direction Y in FIG. 2) moving distance of the inertial object 210 is limited by the block 23, and thus the movement of the inertial object 210 is toward a predetermined direction (horizontal direction X in FIG. 2) without shifting. In this embodiment, there is a distance between the block 23 and the inertial object 210. In other words, the inertial object 219 would move slightly upward, and the upward movement of the inertial object 210 is limited by the block 23 to be within an acceptable range.

In this embodiment, the supporting block 220 and the block 23 are made of the same material to reduce cost. Moreover, while the block 23 is mounted on the cover 22, the supporting block 220 may be mounted on the cover 22 to facilitate the formation of the chip package structure 2.

Accordingly, in the present invention, the block 23 is disposed on the cover 22, so as to limit the movement of the inertial object 210. There is no need to perform etching to form a protruding portion of the cover 22, such that the method of the present invention is simple, takes less time and thus reduces cost. Furthermore, the material of the block 23 is not expensive, and thus the cost of material is significantly reduced.

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

The invention claimed is:

1. A chip package structure, comprising:
   a substrate having a sensing device formed thereon;
   a cover mounted on the substrate for covering the sensing device;
   a block formed on the cover and disposed between the cover and the sensing device; and
   a supporting block formed on the cover, wherein the substrate is covered by the cover via the supporting block.

2. The chip package structure of claim 1, wherein the substrate is a chip.

3. The chip package structure of claim 1, wherein the sensing device has at least an inertial object and a conveying component connected to the inertial object and the substrate, and the block is corresponding to the inertial object for limiting a movement of the inertial object in a direction perpendicular to a surface of the substrate.

4. The chip package structure of claim 3, wherein a distance between the block and the inertial object is 3 to 5 μm.

5. The chip package structure of claim 4, further comprising an adhesive for adhering the cover to the substrate.

6. The chip package structure of claim 1, wherein the cover is made of silicon or glass.

7. The chip package structure of claim 1, further comprising an adhesive for adhering the supporting block to the substrate.

8. The chip package structure of claim 1, wherein the supporting block and the block are made of the same material.

9. A chip package structure, comprising:
   a substrate having a sensing device formed thereon;
   a cover mounted on the substrate for covering the sensing device; and
   a block formed on the cover and disposed between the cover and the sensing device, wherein the block is made of an organic insulation material.

10. A method for forming a chip package structure, comprising the steps of:
    forming at least a block on a cover;
    forming at least a supporting block on the cover;
    providing a substrate having at least a sensing device formed thereon; and
    mounting the cover on the substrate for covering the sensing device, wherein the block is disposed between the cover and the sensing device and wherein the substrate is covered by the cover via the supporting block.

11. The method of claim 10, wherein the substrate and the cover are chips or wafers.

12. The method of claim 10, wherein the sensing device has at least an inertial object and a conveying component connected to the inertial object and the substrate, and the block is corresponding to the inertial object for limiting a movement of the inertial object in a direction perpendicular to a surface of the substrate.

13. The method of claim 12, wherein a distance between the block and the inertial object is 3 to 5 μm.

14. The method of claim 13, wherein the cover is adhered to the substrate via an adhesive, and the distance between the block and the inertial object is controlled by the adhesive.

15. The method of claim 10, wherein the cover is made of silicon or glass.

16. The method of claim 10, wherein the supporting block is adhered to the substrate via an adhesive.

17. The method of claim 10, wherein the supporting block and the block are made of the same material.

18. A method for forming a chip package structure, comprising the steps of:
    forming at least a block on a cover, wherein the block is made of an organic insulation material;
    providing a substrate having at least a sensing device formed thereon; and
    mounting the cover on the substrate for covering the sensing device, wherein the block is disposed between the cover and the sensing device.

* * * * *